United States Patent
Wakabayashi et al.

(10) Patent No.: US 10,101,663 B2
(45) Date of Patent: Oct. 16, 2018

(54) IMPRINT APPARATUS AND METHOD OF MANUFACTURING ARTICLE

(71) Applicant: CANON KABUSHIKI KAISHA, Tokyo (JP)

(72) Inventors: Kohei Wakabayashi, Utsunomiya (JP); Naoki Miyata, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 741 days.

(21) Appl. No.: 13/949,772

(22) Filed: Jul. 24, 2013

(65) Prior Publication Data
US 2014/0027955 A1 Jan. 30, 2014

(30) Foreign Application Priority Data
Jul. 24, 2012 (JP) .................. 2012-164085

(51) Int. Cl.
*B29C 59/02* (2006.01)
*B82Y 40/00* (2011.01)
(Continued)

(52) U.S. Cl.
CPC ............. *G03F 7/70* (2013.01); *B29C 59/02* (2013.01); *B82Y 40/00* (2013.01); *G03F 7/00* (2013.01); *G03F 7/0002* (2013.01)

(58) Field of Classification Search
USPC .................. 264/293, 494, 496; 425/174.4
See application file for complete search history.

(56) References Cited

U.S. PATENT DOCUMENTS 7,343,857 B2 * 3/2008 Sakuarai ............... B82Y 10/00
101/363
8,828,307 B2 9/2014 Okushima et al.
(Continued)

FOREIGN PATENT DOCUMENTS

JP 1163201 A 6/1989
JP 2007019466 A 1/2007
(Continued)

OTHER PUBLICATIONS

Taiwanese Office Action issued in counterpart application No. TW102125384, dated Dec. 21, 2015. English translation provided.
(Continued)

*Primary Examiner* — Jeffrey Wollschlager
*Assistant Examiner* — Armand Melendez
(74) *Attorney, Agent, or Firm* — Rossi, Kimms & McDowell LLP (57) ABSTRACT

An imprint apparatus performs includes an irradiation unit which irradiates a resin on a substrate with light, and a control unit which controls the irradiation unit. The imprinting is performed in an edge shot region, including an edge of the substrate, of a plurality of shot regions on the substrate. The edge shot region includes a pattern forming region where a pattern is to be formed, and a near-edge region closer to a side of the edge than the pattern forming region, and the control unit controls the irradiation unit to irradiate the resin which spreads from a position on the pattern forming region to a position on the near-edge region as the pattern surface comes into contact with the resin in the pattern forming region.

15 Claims, 12 Drawing Sheets

(51) Int. Cl.
*G03F 7/00* (2006.01)
*G03F 7/20* (2006.01)

(56) References Cited

U.S. PATENT DOCUMENTS

| | | | |
|---|---|---|---|
| 8,946,093 B2 | 2/2015 | Mikami | |
| 2006/0192928 A1 | 8/2006 | Kasumi et al. | |
| 2006/0272535 A1* | 12/2006 | Seki | B82Y 10/00 101/492 |
| 2007/0237886 A1* | 10/2007 | Dijksman | B41J 3/4071 427/8 |
| 2008/0297748 A1* | 12/2008 | Smeets | G03F 7/70216 355/53 |
| 2009/0098479 A1 | 4/2009 | Sykes et al. | |
| 2009/0200710 A1* | 8/2009 | Khusnatdinov | B82Y 10/00 264/496 |
| 2009/0224436 A1 | 9/2009 | Mikami et al. | |
| 2011/0267595 A1* | 11/2011 | Mori | G03F 7/70066 355/67 |
| 2012/0149211 A1 | 6/2012 | Ojima | |
| 2012/0208327 A1 | 8/2012 | Matsuoka | |
| 2012/0241409 A1 | 9/2012 | Kobayashi et al. | |
| 2012/0313293 A1 | 12/2012 | Wakabayashi et al. | |

FOREIGN PATENT DOCUMENTS

| | | |
|---|---|---|
| JP | 2011-521438 A | 7/2011 |
| JP | 2011161832 A | 8/2011 |
| JP | 2012089190 A | 5/2012 |
| JP | 2012169475 A | 9/2012 |
| JP | 2012-199329 A | 10/2012 |
| JP | 2012199410 A | 10/2012 |
| JP | 2013069919 A | 4/2013 |
| KR | 1020070100963 A | 10/2007 |
| KR | 1020090130294 A | 12/2009 |
| WO | 2009/099666 A1 | 8/2009 |

OTHER PUBLICATIONS

Office Action issued in KR10-2013-0085927, dated Jan. 14, 2016.
Office Action issued in Japanese Appln. No. 2012-164085 dated Jun. 6, 2016.
Notice of Allowance issued in U.S. Appl. No. 13/490,547 dated Oct. 13, 2017.
Office Action issued in U.S. Appl. No. 13/490,547 dated Jun. 2, 2017.
Office Action issued in U.S. Appl. No. 13/490,547 dated Aug. 4, 2014.
Office Action issued in U.S. Appl. No. 13/490,547 dated Feb. 27, 2015.
Office Action issued in U.S. Appl. No. 13/490,547 dated Oct. 6, 2015.
Office Action issued in U.S. Appl. No. 13/490,547 dated Apr. 20, 2016.
Office Action issued in U.S. Appl. No. 13/490,547 dated Sep. 23, 2016.
Office Action issued in Japanese Patent Application No. 2011-130620 dated Feb. 27, 2015.

* cited by examiner

IMPRINT APPARATUS AND METHOD OF MANUFACTURING ARTICLE

BACKGROUND OF THE INVENTION

1. Field of the Invention

The present invention relates to an imprint apparatus and a method of manufacturing an article using the same.

2. Description of the Related Art

The imprint technique is advantageous in transferring a nanoscale fine pattern, and is coming into practical use as one of nanolithography techniques for volume production of articles such as magnetic storage media and semiconductor devices. In the imprint technique, an electron beam drawing apparatus, for example, is employed to form a fine pattern on a substrate such as a silicon wafer or a glass plate using, as an original, a mold (die) having a fine pattern formed on it. A fine pattern is formed by coating a resin on a substrate, curing the resin irradiated with light while the pattern surface of a mold is kept in contact with the resin, and releasing the mold from the resin.

Japanese Patent Laid-Open No. 2011-521438 describes a method of preventing a polymerizable material from flowing out of a desired imprint region, and "burrs" from being formed. In this method, a polymerizable material within a "band" as the periphery of an imprint region is exposed to be cured and/or solidified, and then a polymerizable material within the region surrounded by the "band" is exposed and/or solidified. In exposing the polymerizable material within the "band", the polymerizable material within the region surrounded by the "band" is blocked against light by a mask.

In arranging a plurality of shot regions on a substrate, a plurality of shot regions with identical rectangular shapes are often arranged. However, when one shot region includes a plurality of chip regions, arranging shot regions including the edge of the substrate (to be referred to as edge shot regions hereinafter) on the periphery of the substrate is effective in manufacturing a larger number of chips from one substrate. An edge shot region is arranged to include at least one chip region. Japanese Patent Laid-Open No. 2011-521438 does not describe details of a method of imprinting in the edge shot region, but it is surmised that each shot region is arranged so as not to protrude from a valid region (a region where a device can be arranged) on the substrate. When the method described in Japanese Patent Laid-Open No. 2011-521438 is applied to imprinting on a substrate having edge shot regions, in the edge shot regions, the resin may be drawn by suction into the recesses of the pattern due to a capillary action, and flow out of the substrate along these recesses. Alternatively, as the pattern surface of the mold comes into contact with the resin, the resin may simply spread horizontally and flow out of the substrate.

SUMMARY OF THE INVENTION

The present invention provides a technique advantageous in terms of suppressing protrusion of a resin from a substrate when imprinting in edge shot regions is performed.

The first aspect of the invention provides an imprint apparatus which performs imprinting in which a photo-curing resin is coated on a substrate, a pattern surface of a mold is brought into contact with the resin, and the resin is cured with light, to transfer a pattern of the mold onto the substrate, the apparatus comprising: an irradiation unit which irradiates the resin on the substrate with light; and a control unit which controls the irradiation unit, wherein imprinting is performed in an edge shot region, including an edge of the substrate, of a plurality of shot regions on the substrate, the edge shot region includes a pattern forming region where a pattern is to be formed, and a near-edge region closer to a side of the edge than the pattern forming region, and the control unit controls the irradiation unit to irradiate the resin which spreads from a position on the pattern forming region to a position on the near-edge region as the pattern surface comes into contact with the resin in the pattern forming region.

The second aspect of the invention provides a method of manufacturing an article, the method comprising the steps of: performing imprinting in which a photo-curing resin is coated on a substrate, a pattern surface of a mold is brought into contact with the resin, and the resin is cured with light, to transfer a pattern of the mold onto the substrate; and processing the substrate having undergone the imprinting, wherein the apparatus comprises an irradiation unit which irradiates the resin on the substrate with light, and a control unit which controls the irradiation unit, and wherein imprinting is performed in an edge shot region, including an edge of the substrate, of a plurality of shot regions on the substrate, the edge shot region includes a pattern forming region where a pattern is to be formed, and a near-edge region closer to a side of the edge than the pattern forming region, and the control unit controls the irradiation unit to irradiate the resin which spreads from a position on the pattern forming region to a position on the near-edge region as the pattern surface comes into contact with the resin in the pattern forming region.

Further features of the present invention will become apparent from the following description of exemplary embodiments with reference to the attached drawings.

DESCRIPTION OF THE EMBODIMENTS

Figure 1:
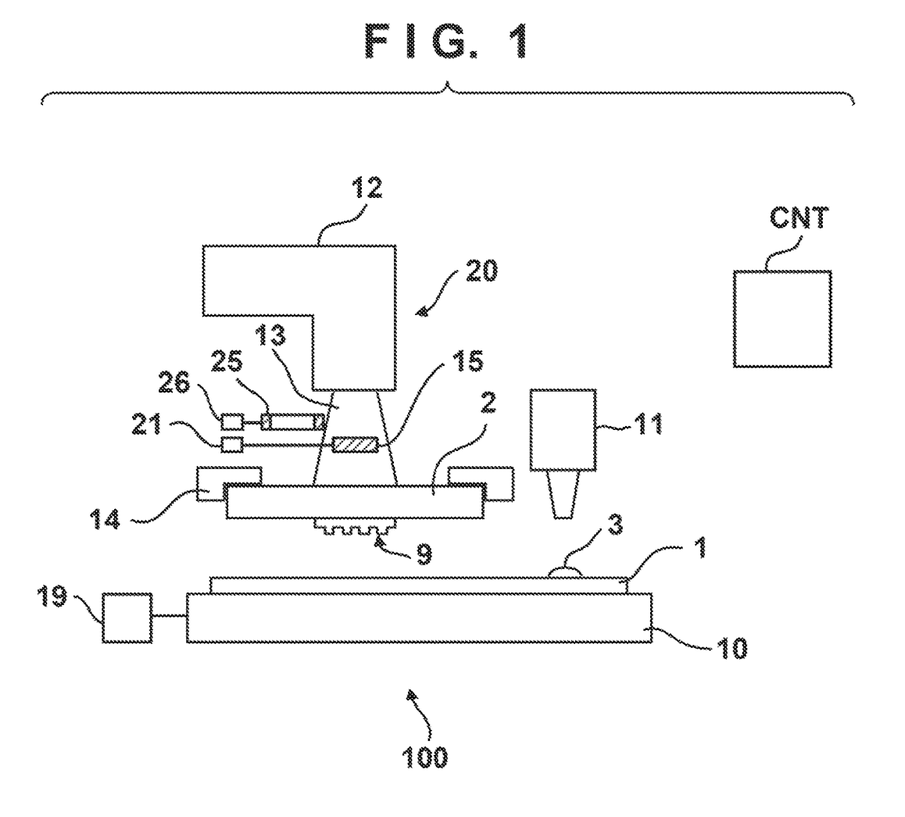
FIG. 1 is a view showing the schematic configuration of an imprint apparatus according to an embodiment of the present invention.

An imprint apparatus 100 according to an embodiment of the present invention will be described below with reference to FIG. 1. The imprint apparatus 100 can include, for example, a substrate stage 10, coating unit 11, imprint head 14, stage driving mechanism 19, irradiation unit 20, and control unit CNT. The imprint apparatus 100 coats a resin 3 on a substrate 1 using the coating unit 11, brings a pattern surface 9 of a mold 2 into contact with the resin 3 using the imprint head 14, and irradiates the resin 3 with light (for example, ultraviolet light) 13 using the irradiation unit 20 to cure the resin 3. Such an operation can be called imprinting.

The substrate stage 10 holds the substrate 1. The stage driving mechanism 19 positions the substrate stage 10 to position a shot region on the substrate 1 at a target position. The coating unit 11 coats the resin 3 on the shot region on the substrate 1. The imprint head 14 has a mold holding unit which holds the mold 2, and brings the pattern surface 9 of the mold 2 held by the mold holding unit into contact with the resin coated on the substrate 1 by the coating unit 11, or releases the mold 2 from the cured resin 3. The resin 3 on the substrate 1 is irradiated with the light 13 by the irradiation unit 20 to cure the resin 3. The control unit CNT is configured to control at least the irradiation unit 20. Typically, the control unit CNT can be configured to control not only the irradiation unit 20, but also the substrate stage 10, coating unit 11, imprint head 14, and stage driving mechanism 19. In this embodiment, the control unit CNT is configured to control not only the irradiation unit 20, but also the substrate stage 10, coating unit 11, imprint head 14, and stage driving mechanism 19.

The coating unit 11 can include, for example, a plurality of nozzles which discharge a resin 3 in a liquid phase. The discharge of the resin 3 from the plurality of nozzles is individually controlled so that the resin 3 can be coated on a shot region with an arbitrary shape. Note that a plurality of shot regions arrayed on the substrate 1 can include edge shot regions including the edge of the substrate 1, as described earlier. Each edge shot region has a shape corresponding to its position on the substrate 1.

Figure 2A:
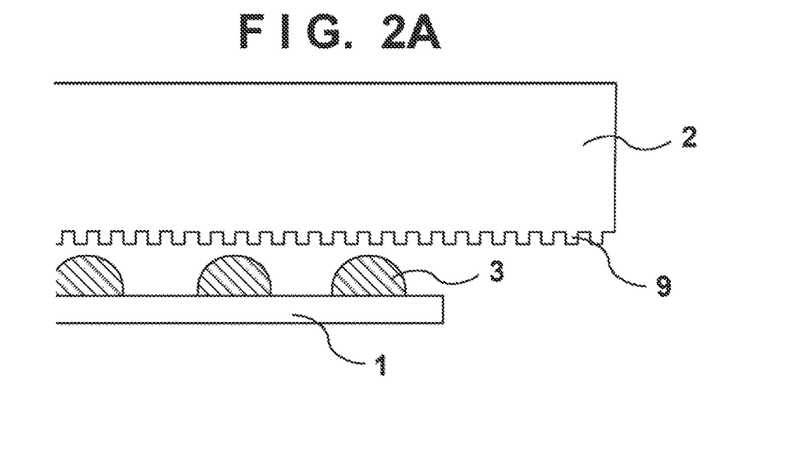
FIGS. 2A to 2C are views schematically showing imprinting in an edge shot region.
Figure 2B:
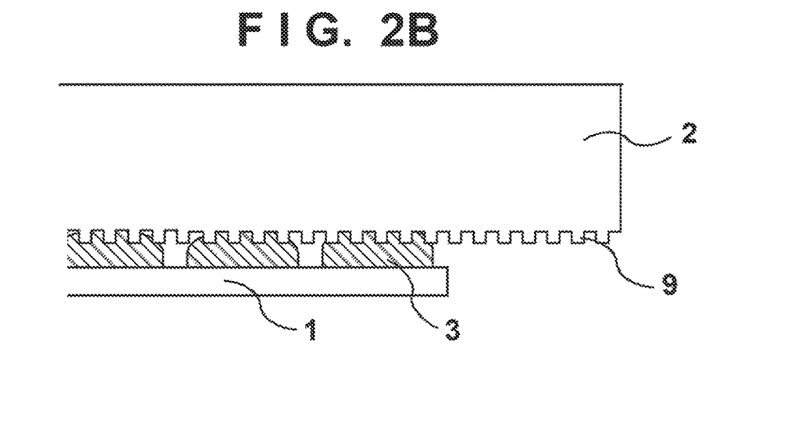
Figure 2C:
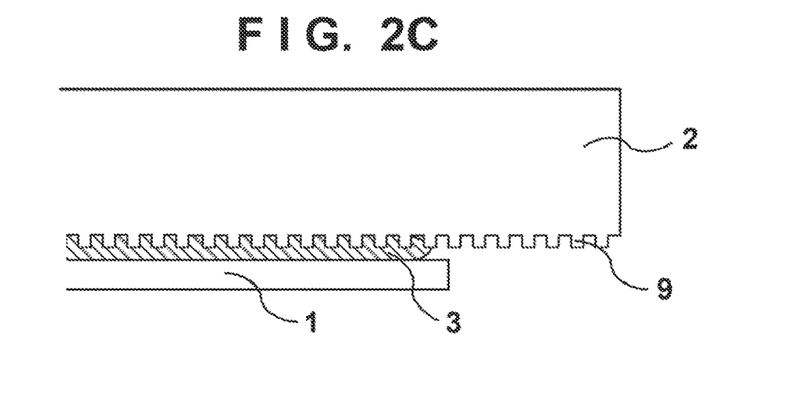

FIG. 2A schematically shows the resin 3 coated on the substrate 1 by the coating unit 11 in imprinting in the edge shot region. The resin 3 can be coated on the substrate 1 as a plurality of droplets separated from each other. However, the resin 3 may be coated on the substrate 1 as a mass of droplets. FIG. 2B schematically shows the state where the pattern surface 9 of the mold 2 is brought into contact with the resin 3 by lowering the mold 2 by the imprint head 14. Droplets of the resin 3 are squeezed by the pattern surface 9 and spread horizontally, so the gas between the droplets is pushed outwards. FIG. 2C schematically shows the state where the gap between the pattern surface 9 of the mold 2 and the shot region on the substrate 1 is filled with the resin 3 by further lowering the mold 2 by the imprint head 14.

FIG. 2C schematically shows the state where the resin 3 is in contact with the pattern surface 9 of the mold 2 without protruding outwards from the substrate 1. In this state, the resin 3 is irradiated with the light 13 using the irradiation unit 20 to cure the resin 3. After the resin 3 cures, the mold 2 is lifted by the imprint head 14 to release it from the resin 3.

Figure 3:
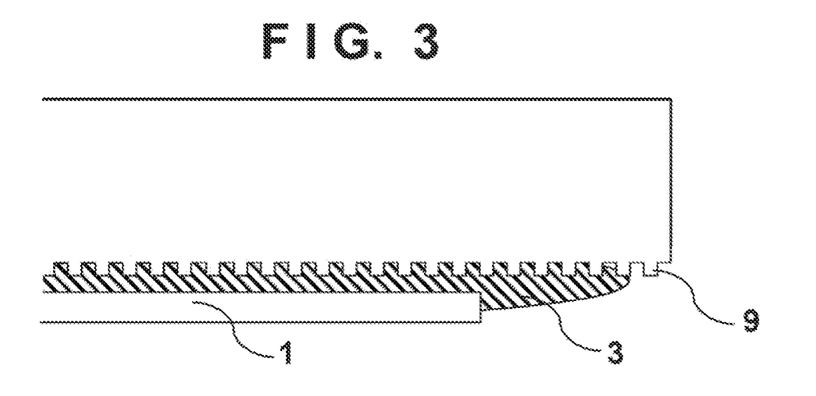
FIG. 3 is a view schematically showing how a resin protrudes outwards from a substrate in imprinting in the edge shot region.

FIG. 3 schematically shows the state where the resin 3 protrudes outwards from the substrate 1 in imprinting in the edge shot region. Protrusion of the resin 3 from the substrate 1 may occur due, for example, to a control error of the amount of coating of the resin 3 on the substrate 1, that of the position where the resin 3 is coated on the substrate 1, or that of the interval between the pattern surface 9 of the mold 2 and the substrate 1. The resin 3 may be drawn by suction into recesses, formed in the pattern surface 9 of the mold 2, due to a capillary action, and flow out of the substrate 1 along these recesses. Alternatively, as the pattern surface 9 of the mold 2 comes into contact with the resin 3, the resin 3 may spread horizontally, and flow out of the substrate 1. When the resin 3 is irradiated with the light 13 by the irradiation unit 20 while protruding outwards from the substrate 1, it cures and may float as particles upon separating from the substrate 1 or mold 2. Alternatively, the resin 3 adhered to the mold 2 may generate a defect in a pattern, formed on the substrate 1, upon imprinting in the next shot region. Alternatively, the resin 3 adhered to the mold 2 may generate a defect in the pattern surface 9 of the mold 2 upon imprinting.

Figure 4:
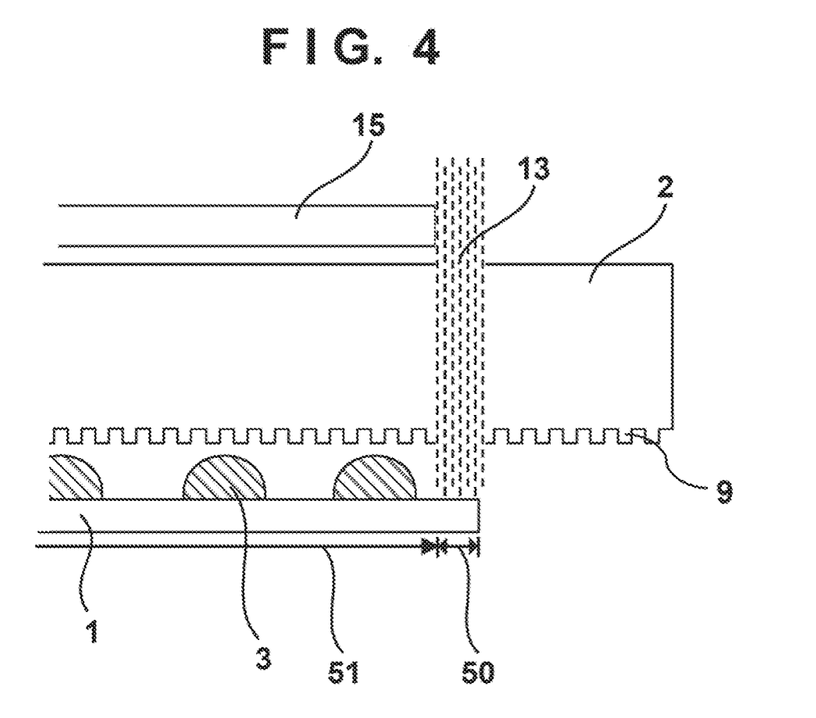
FIG. 4 is a view schematically showing irradiation of a near-edge region with light.

In this embodiment, protrusion of the resin 3 from the substrate 1, as described above, is prevented or suppressed. The terms "near-edge region" and "pattern forming region" to be used hereinafter will be described herein with reference to FIG. 4. FIG. 4 schematically shows a near-edge region 50 and a pattern forming region 51. The near-edge region 50 is a region near the edge of the substrate 1. The near-edge region 50 may or may not include the edge of the substrate 1. The pattern forming region 51 is a region where a pattern is to be formed, and is formed by a set of chip regions cut into chips.

Imprinting in the edge shot region in this embodiment will be described below.

In imprinting in the edge shot region, the control unit CNT controls the irradiation unit 20 to irradiate the pattern forming region 51 with light while the pattern surface 9 is in contact with the resin in the pattern forming region 51 after the timing at which irradiation of the near-edge region 50 with light starts. Note that the near-edge region 50 and pattern forming region 51 are defined in an edge shot region to undergo imprinting.

For example, in imprinting in the edge shot region, the control unit CNT can control the irradiation unit 20 so that
  (a) irradiation of the near-edge region 50 with light starts before the resin in the pattern forming region 51 spreads to the near-edge region 50 on the substrate 1, and
  (b) the pattern forming region 51 is irradiated with light while the pattern surface 9 is in contact with the resin in the pattern forming region 51.

Note that in irradiating the near-edge region 50 with light, the exterior of the substrate 1 may also be irradiated with light. Also, irradiation of the pattern forming region 51 with light while the pattern surface 9 is in contact with the resin in the pattern forming region 51 may start after irradiation of the near-edge region 50 with light ends, or start before irradiation of the near-edge region 50 with light ends. Alternatively, the near-edge region 50 may also be irradiated with light when the pattern forming region 51 is irradiated with light while the pattern surface 9 is in contact with the resin in the pattern forming region 51.

FIG. 4 schematically shows the state where the near-edge region 50 is irradiated with the light 13 by the irradiation unit 20 in imprinting in the edge shot region. The timing at which irradiation of the near-edge region 50 with light starts can be an arbitrary timing before the resin 3 in the pattern forming region 51 spreads to the near-edge region 50. The timing at which irradiation of the near-edge region 50 with light can be, for example, before the pattern surface 9 of the mold 2 comes into contact with the resin 3 in the pattern forming region 51. The timing at which irradiation of the near-edge region 50 with light starts may be, for example, after the pattern surface 9 of the mold 2 comes into contact with the resin 3 in the pattern forming region 51, and before the resin 3 flows into the near-edge region 50 as the interval between the pattern surface 9 and the substrate 1 reduces. The timing at which irradiation of the near-edge region 50 with light ends can be the time to sufficiently cure the resin in the near-edge region 50 after irradiation of the near-edge region 50 with light starts.

Figure 5:
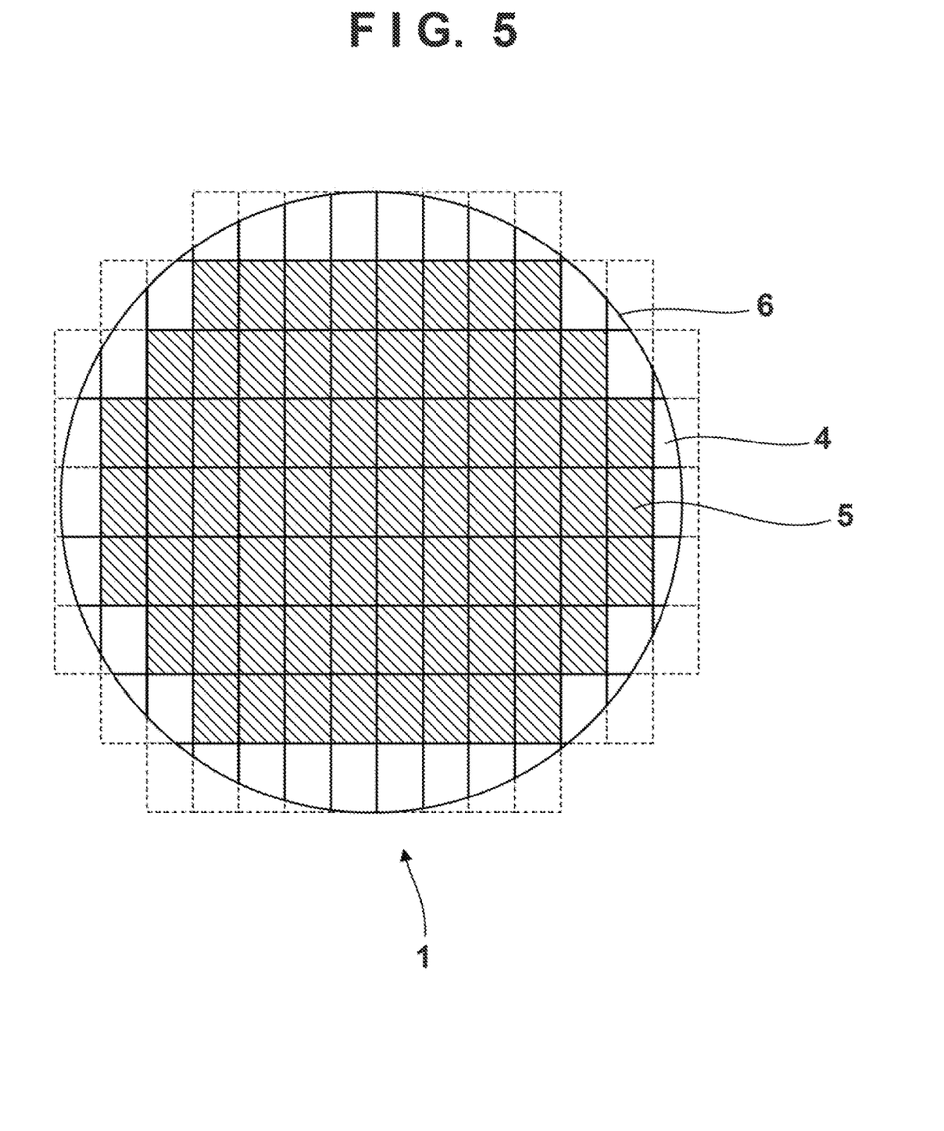
FIG. 5 is a view illustrating a plurality of shot regions arrayed on a substrate.

FIG. 5 illustrates a plurality of shot regions arrayed on the substrate 1. The plurality of shot regions arrayed on the substrate 1 include edge shot regions 4 and non-edge shot regions 5. The edge shot regions 4 are shot regions including an edge 6 of the substrate 1, and are indicated by white figures which partially include an arc as the edge 6. The non-edge shot regions 5 are shot regions other than the edge shot regions 4, and are indicated by hatched rectangles.

Figure 6:
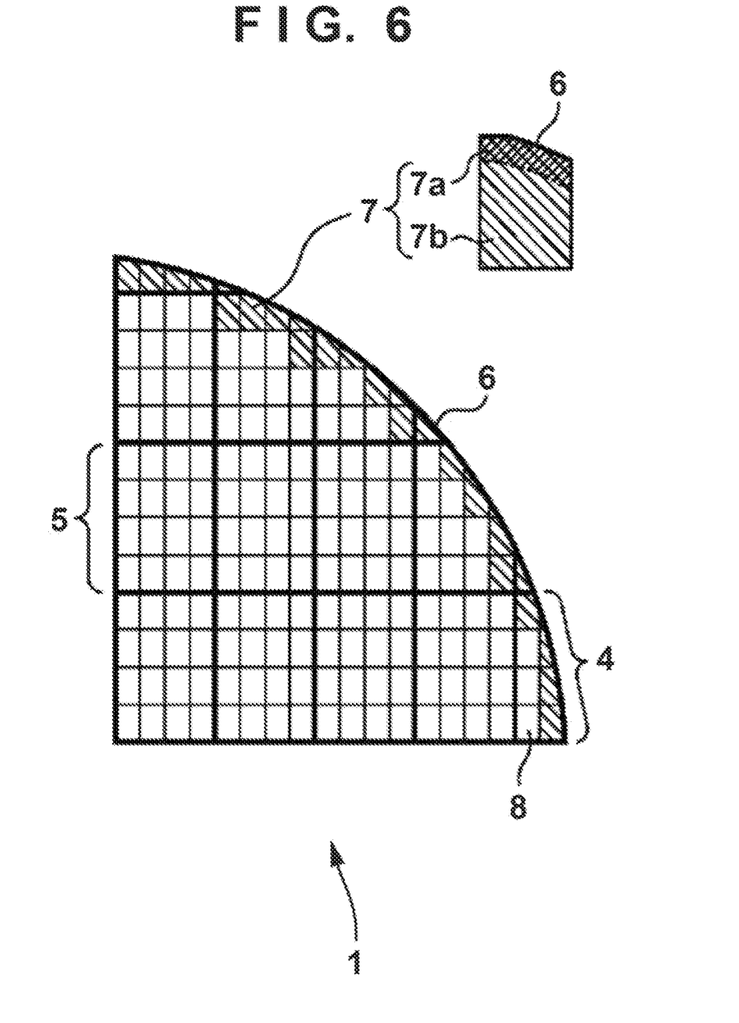
FIG. 6 is a view illustrating edge shot regions.

As illustrated in FIG. 6, the edge shot region 4 includes at least one chip region 8, and the non-edge shot region 5 includes a plurality of chip regions 8. Note that each chip region 8 is indicated by a white rectangle. The substrate 1 can have an invalid region 7a near the edge 6. The width of the invalid region 7a can be determined in accordance with the specifications of the substrate 1, and the design specifications of a chip, and the dimension of the substrate 1 in the radial direction can fall within the range of, for example, 0 mm to 3 mm. The edge shot region 4 includes an invalid chip region 7. The invalid chip region 7 can include not only the invalid region 7a, but also a valid region (a region where a device can be arranged) 7b inside the invalid region 7a. The near-edge region 50 can be the invalid chip region 7 or its part. Alternatively, the near-edge region 50 can be the invalid region 7a or its part. The pattern forming region 51 includes the chip region 8.

Figure 7:
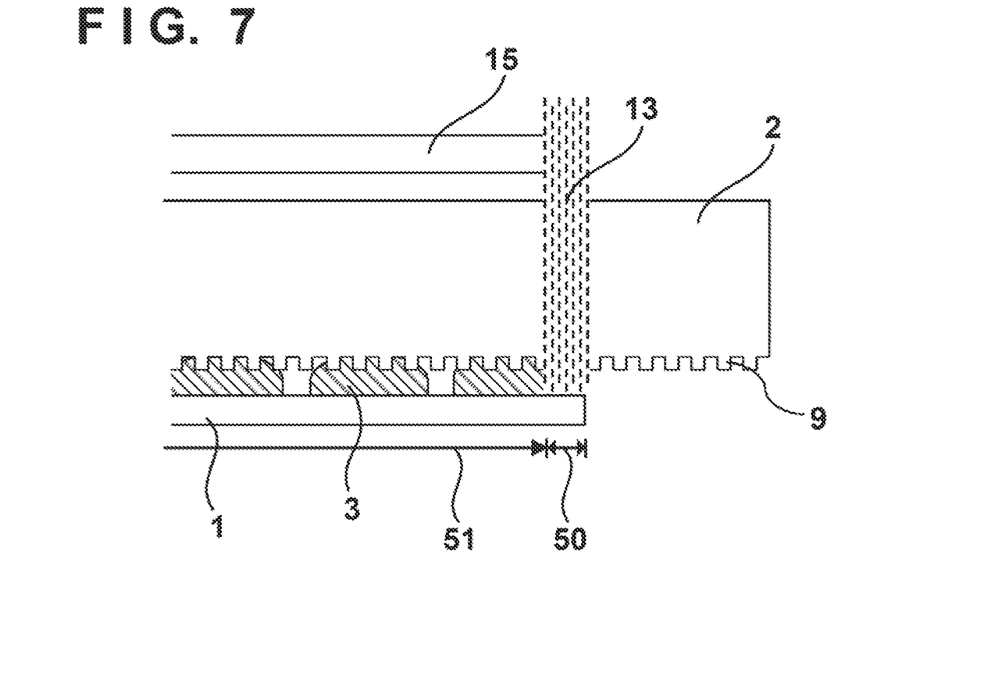
FIG. 7 is a view for explaining imprinting in the edge shot region.

In this embodiment, as described earlier, the pattern forming region 51 is irradiated with the light 13 while the pattern surface 9 is in contact with the resin in the pattern forming region 51 after irradiation of the near-edge region 50 with the light 13 starts in imprinting in the edge shot region. FIG. 7 schematically shows an operation of bringing the pattern surface 9 into contact with the resin in the pattern forming region 51 after irradiation of the near-edge region 50 with light starts. The viscosity of the resin 3 can fall within, for example, 10 to 20 cP (centipoises). The viscosity of the resin 3 can be determined in consideration of, for example, the characteristics of discharge of a resin by the coating unit 11, and the filling time of the recesses in the pattern surface 9 of the mold 2 with the resin 3.

The resin 3 in the pattern forming region 51 that is not irradiated with the light 13 may be squeezed by the pattern surface 9 of the mold 2, spread horizontally, and enter the near-edge region 50. Since the near-edge region 50 is irradiated with the light 13, the resin 3 that enters the near-edge region 50 can be cured by irradiation with the light 13. This prevents or suppresses protrusion of the resin 3 from the substrate 1. Although the coating unit 11 preferably does not coat the resin 3 on the near-edge region 50, it may coat the resin 3 on the near-edge region 50. The coating unit 11 may intentionally coat the resin 3 on the near-edge region 50, but can typically unintentionally does so due to a control error.

The resin 3 in the near-edge region 50 may or may not be completely cured until the interval between the pattern surface 9 and the substrate 1 is controlled to a target interval by the imprint head 14 to form the pattern of the resin 3 in the pattern forming region 51. The degree of curing of the resin 3 in the near-edge region 50 can be controlled in accordance with the wavelength of the light 13 with which the irradiation unit 20 irradiates the near-edge region 50, and/or the time for the irradiation unit 20 to irradiate the near-edge region 50 with the light 13.

Figure 8:
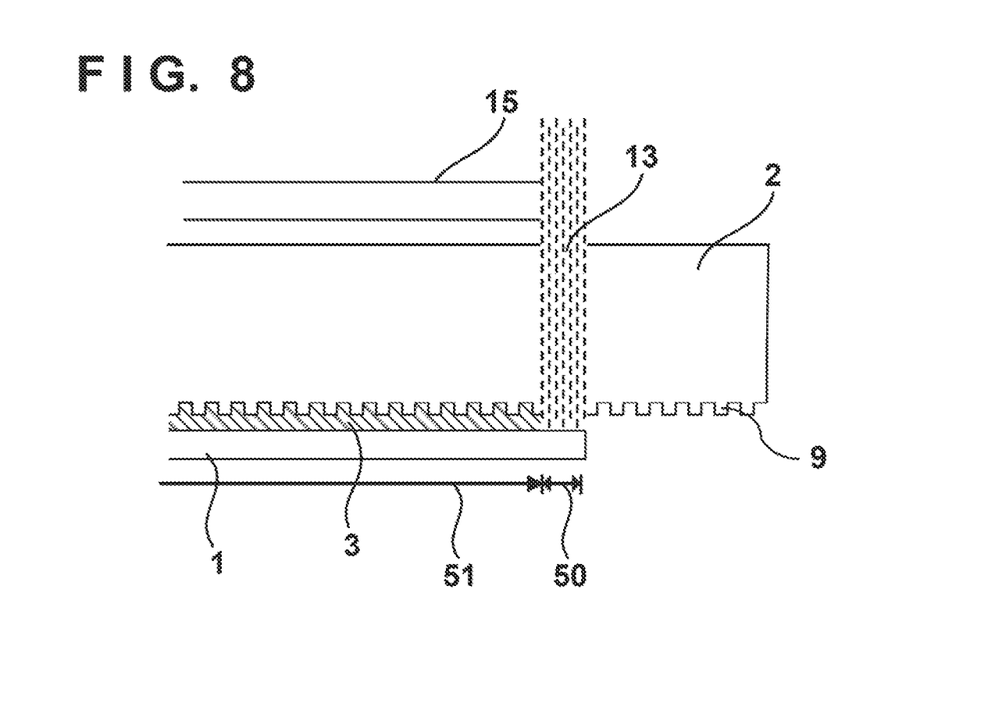
FIG. 8 is a view for explaining imprinting in the edge shot region.

FIG. 8 schematically shows the state where the recesses in the pattern surface 9 are filled with the resin 3 upon narrowing the interval between the pattern surface 9 of the mold 2 and the substrate 1 while the near-edge region 50 is irradiated with light. At this time as well, the resin 3 that enters the near-edge region 50 is cured with light which irradiates the near-edge region 50, and its protrusion from the substrate 1 is prevented or suppressed.

Figure 9:
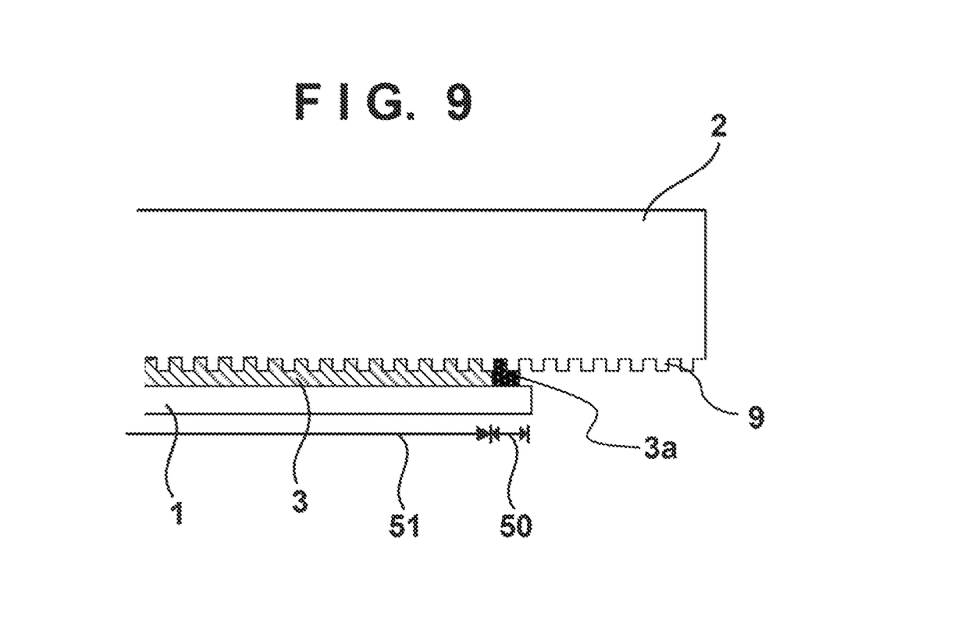
FIG. 9 is a view for explaining imprinting in the edge shot region.
Figure 10:
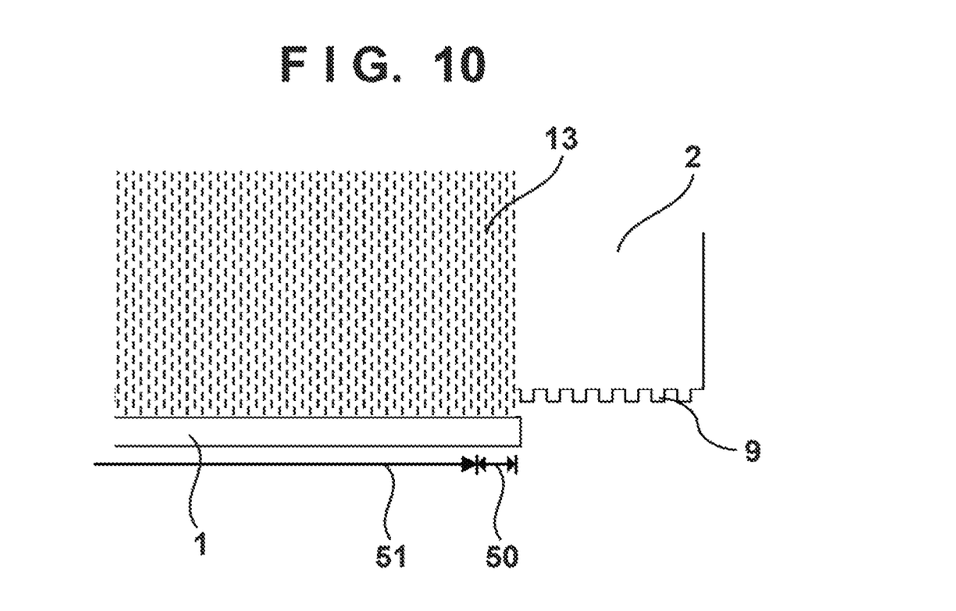
FIG. 10 is a view for explaining imprinting in the edge shot region.

FIG. 9 schematically shows a resin 3a cured in the near-edge region 50. The cured resin 3a functions as a bank which limits the spread of the uncured resin 3. FIG. 10 schematically shows the state where the resin in the pattern forming region 51 is irradiated with light. At this time, not only the pattern forming region 51 but also the near-edge region 50 may be irradiated with light, or the region (substrate stage 10) outside the substrate 1 may be irradiated with light.

Figure 11A:
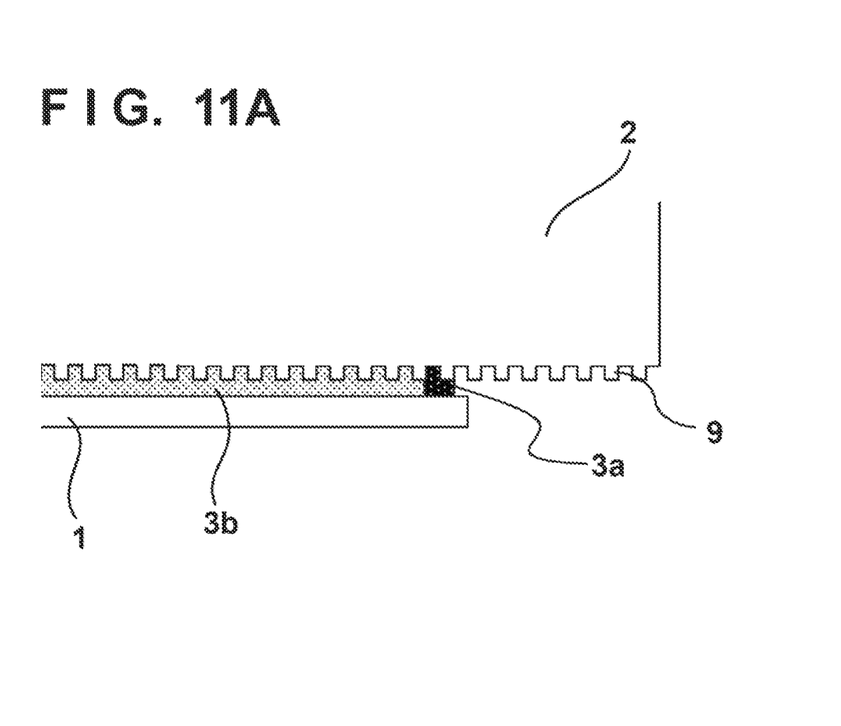
FIGS. 11A and 11B are views for explaining imprinting in the edge shot region.
Figure 11B:
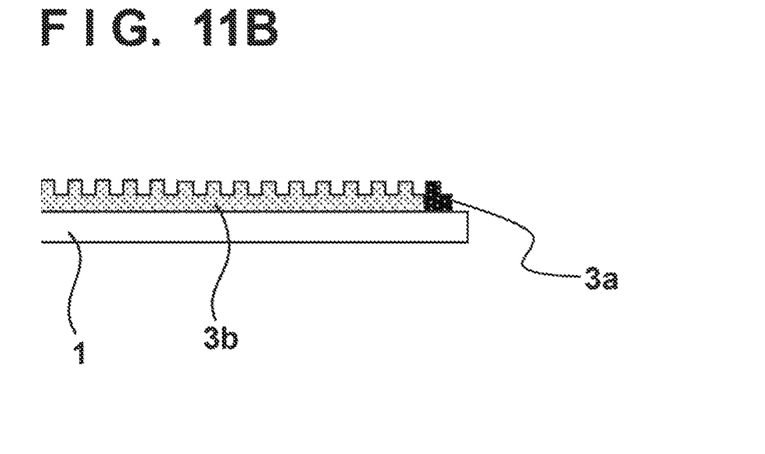

FIG. 11A schematically shows a resin 3b in the pattern forming region 51 cured by irradiation with the light 13. FIG. 11B schematically shows the state where the mold 2 is released from the cured resins 3a and 3b.

The irradiation unit 20 can include a light source 12, and a mask 15 which blocks the light 13 from the light source 12 so as not to irradiate the pattern forming region 51 with the light 13 in irradiating the near-edge region 50 with light. The irradiation unit 20 can also include a driving mechanism 21 for inserting the mask 15 into the optical path between the light source 12 and the mold 2 in irradiating the near-edge region 50 with light, or removing the mask 15 from this optical path. The irradiation unit 20 may moreover include a mask 25 which blocks light in the peripheral shot regions in irradiating the pattern forming region 51 of the edge shot region, and the non-edge shot region. The mask 25 can be driven by a driving mechanism 26.

Figure 12:
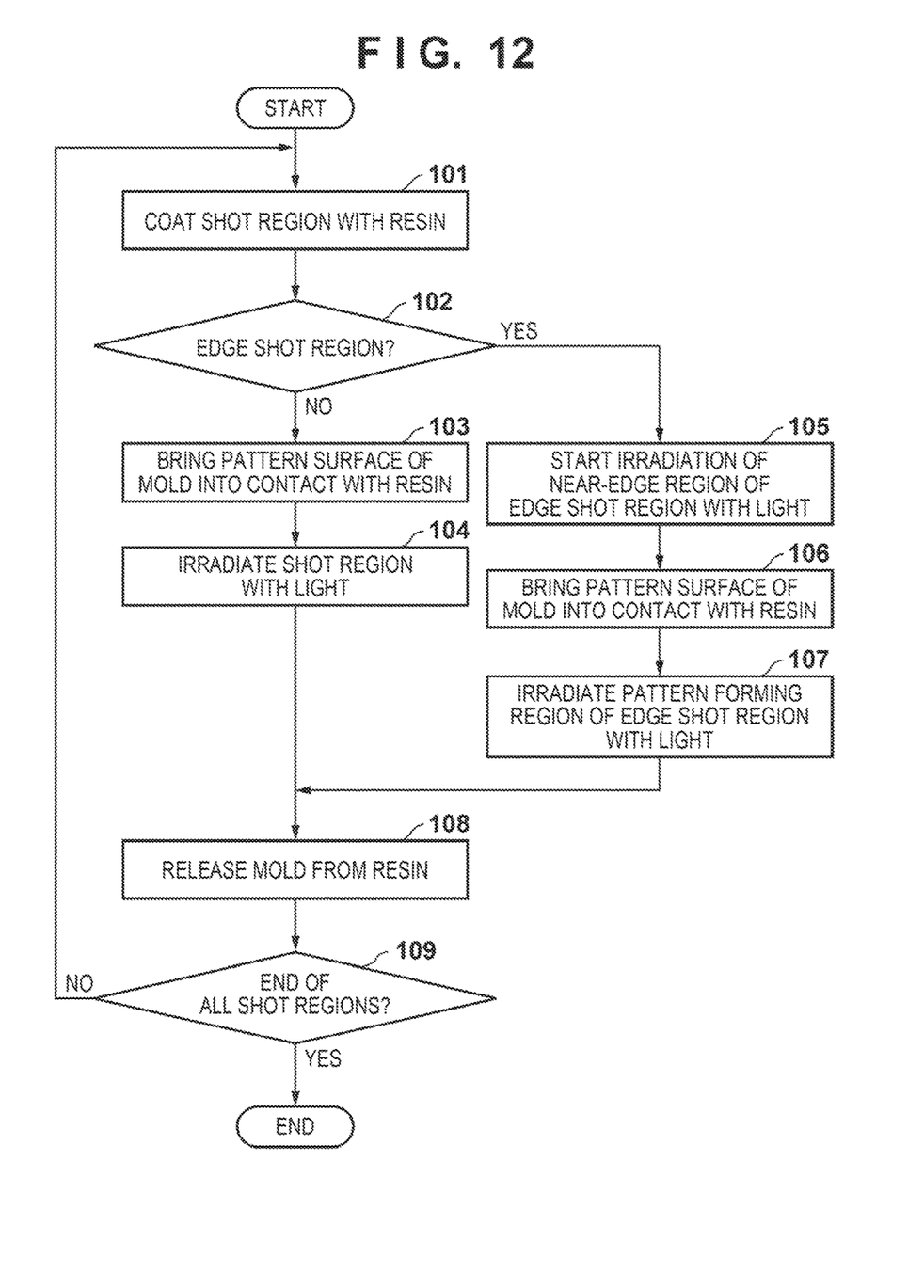
FIG. 12 is a flowchart illustrating the sequence of imprinting in a plurality of shot regions on a substrate.

Imprinting in a plurality of shot regions on the substrate 1 by the imprint apparatus 100 in this embodiment will be exemplified below with reference to FIG. 12. A sequence shown in FIG. 12 is controlled by the control unit CNT. In step 101, the coating unit 11 coats the resin 3 on a shot region to undergo imprinting. In step 102, it is determined whether the shot region to undergo imprinting is an edge shot region or a non-edge shot region. If the shot region to undergo imprinting is a non-edge shot region, the process advances to step 103; otherwise, the process advances to step 105.

In step 103, the substrate stage 10 is driven by the stage driving mechanism 19 so that the shot region to undergo imprinting is arranged below the mold 2. The mold 2 is then driven so that the pattern surface 9 of the mold 2 is brought into contact with the resin 3 in the shot region, to undergo imprinting, by the imprint head 14.

In step 104, the resin 3 in the shot region to undergo imprinting is irradiated with light by the irradiation unit 20 to cure the resin 3. In step 108, the mold 2 is driven so as to be released from the cured resin 3 by the imprint head 14.

In step 109, it is determined whether imprinting in all shot regions has ended. If a shot region to undergo imprinting remains, the process returns to step 101.

In step 105, the substrate stage 10 is driven by the stage driving mechanism 19 so that the edge shot region to undergo imprinting is arranged below the mold 2. Irradiation of the resin in the near-edge region 50 of the edge shot region with light starts. This irradiation operation with light stops after the time elapses to sufficiently cure the resin in the near-edge region 50. In step 106, the mold 2 is driven so that the pattern surface 9 of the mold 2 is brought into contact with the resin 3 in the shot region, to undergo imprinting, by the imprint head 14.

In step 107, the resin 3 in the pattern forming region 51 of the edge shot region is irradiated with light by the irradiation unit 20 to cure the resin 3. In step 108, the mold 2 is driven so as to be released from the cured resin 3 by the imprint head 14.

FIGS. 13A to 13D illustrate a first configuration example of the irradiation unit 20. Note that the driving mechanism 21 shown in FIG. 1 is not shown in FIGS. 13A to 13D. The irradiation unit 20 can include a positioning mechanism 70 which positions the mask 15 in accordance with the shot region to undergo imprinting of a plurality of shot regions. The mask 15 can have an arcuated outer edge. The radius of the arc can be determined so as not to irradiate the interior of the near-edge region 50 with light. The positioning mechanism 70 can include a rotational driving mechanism 16 which rotationally drives the mask 15 about the optical axis of the irradiation unit 20, and a translational driving mechanism 17 which translationally drives the mask 15 in a direction perpendicular to the optical axis of the irradiation unit 20. Referring to FIGS. 13A to 13D, a region A indicates the position of an edge shot region. The mask 15 preferably has an arcuated outer edge, but may have a linear or polygonal linear outer edge.

Figure 13A:
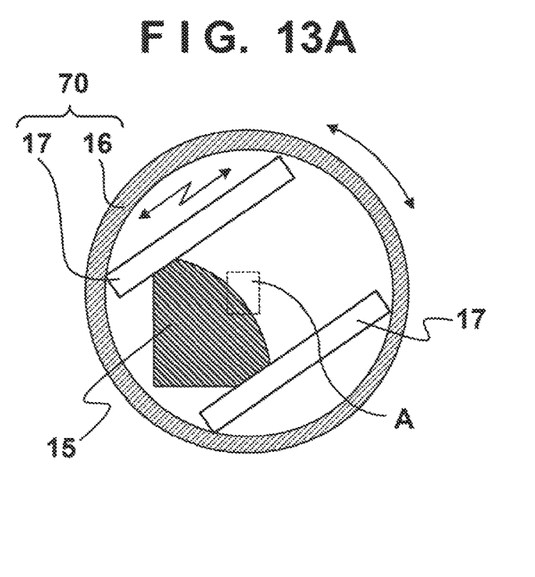
FIGS. 13A to 13D are views illustrating a first configuration example of an irradiation unit.
Figure 13B:
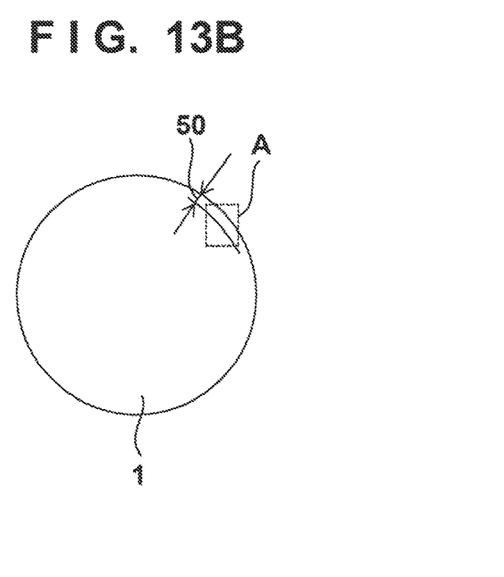
Figure 13C:
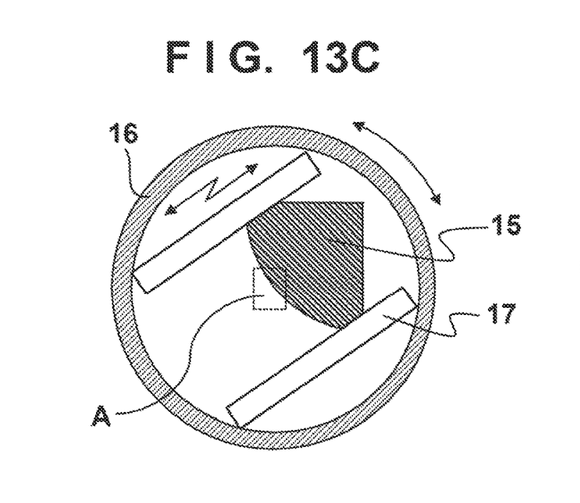
Figure 13D:
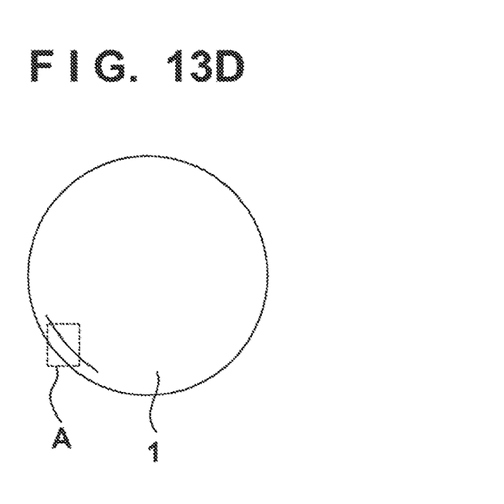

In imprinting in an edge shot region arranged in the region A shown in FIG. 13B, the mask 15 can be positioned by the rotational driving mechanism 16 and translational driving mechanism 17, as shown in FIG. 13A. In imprinting in an edge shot region arranged in the region A shown in FIG. 13D, the mask 15 can be positioned by the rotational driving mechanism 16 and translational driving mechanism 17, as shown in FIG. 13C. Driving of the mask 15 by the rotational driving mechanism 16 and translational driving mechanism 17 can be controlled in accordance with the position of the shot region to undergo imprinting of a plurality of shot regions.

Figure 14:
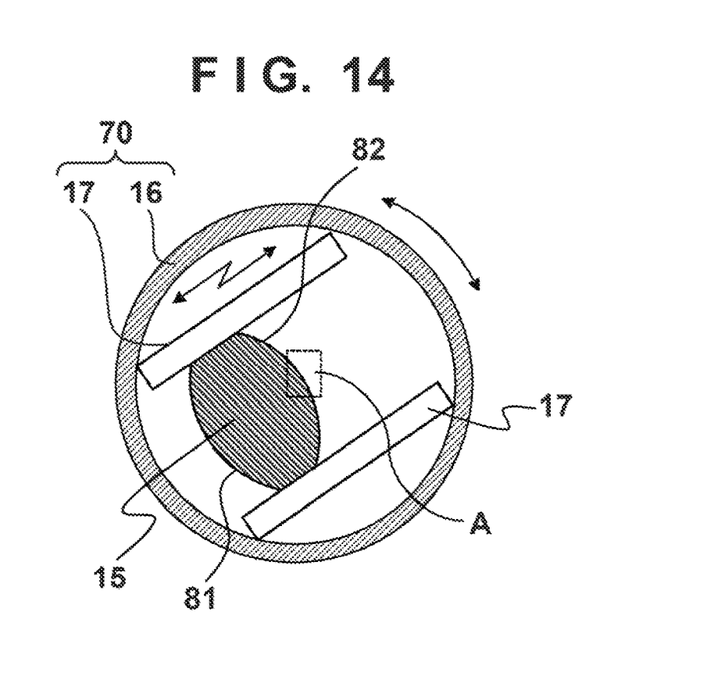
FIG. 14 is a view illustrating a second configuration example of the irradiation unit.

FIG. 14 illustrates a second configuration example of the irradiation unit 20. Note that the driving mechanism 21 shown in FIG. 1 is not shown in FIG. 14. The second configuration example is a modification to the first configuration example. In the second configuration example, the mask 15 has two arcuated outer edges 81 and 82. The two arcuated outer edges 81 and 82 are arranged to have convex shapes bulged in opposite directions as viewed from the center of the mask 15. With this operation, the rotational driving mechanism 16 rotationally drives the mask 15 through a maximum of 180° to process edge shot regions at all positions. In contrast to this, in the first configuration example, the rotational driving mechanism 16 must rotationally drive the mask 15 through a maximum of 360°. This makes it possible to improve the throughput of imprinting in edge shot regions, and simplify the configuration of the rotational driving mechanism 16. However, the maximum angle of rotation of the mask 15 by the rotational driving mechanism 16 is not limited to 180°, and may be a larger maximum angle of rotation.

Figure 15:
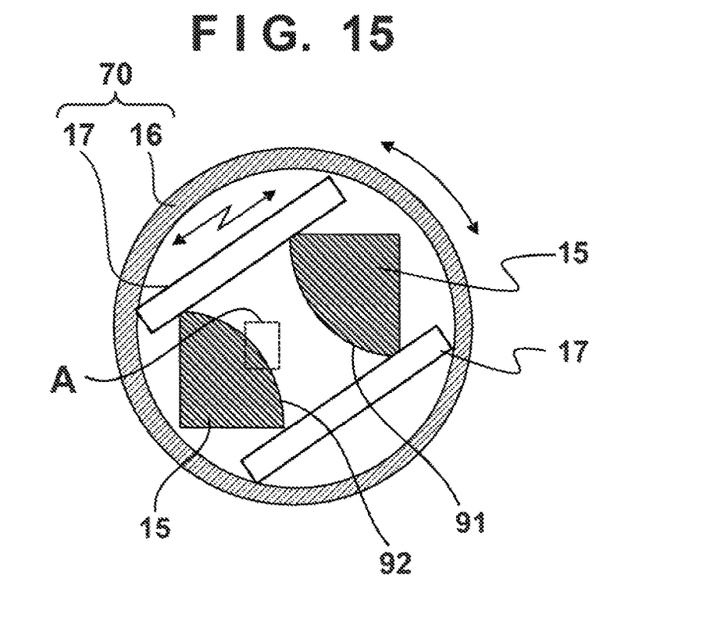
FIG. 15 is a view illustrating a third configuration example of the irradiation unit.

FIG. 15 illustrates the third configuration example of the irradiation unit 20. Note that the driving mechanism 21 shown in FIG. 1 is not shown in FIG. 15. The third configuration example is a modification to the second configuration example. In the third configuration example, two masks 15 having arcuated outer edges 91 and 92, respectively, are provided, and the two arcuated outer edges 91 and 92 are arranged to have convex shapes bulged toward the opening between the two masks 15.

In the second configuration example, the two arcuated outer edges 81 and 82 are arranged to have convex shapes bulged in opposite directions as viewed from the center of the mask 15. Hence, when the outer edge 81 is used to imprint in one edge shot region, and the outer edge 82 is then used to imprint in another edge shot region, the mask 15 traverses the optical axis, so the substrate cannot be irradiated with light during this process. In contrast to this, in the third configuration example, the two arcuated outer edges 91 and 92 are arranged to have convex shapes bulged toward the opening between the two masks 15. Hence, in the third configuration example, when the outer edge 91 is used to imprint in one edge shot region, and the outer edge 92 is then used to imprint in another edge shot region, the mask 15 does not traverse the optical axis. Therefore, the throughput can be set higher in the third configuration example than in the second configuration example.

Figure 16:
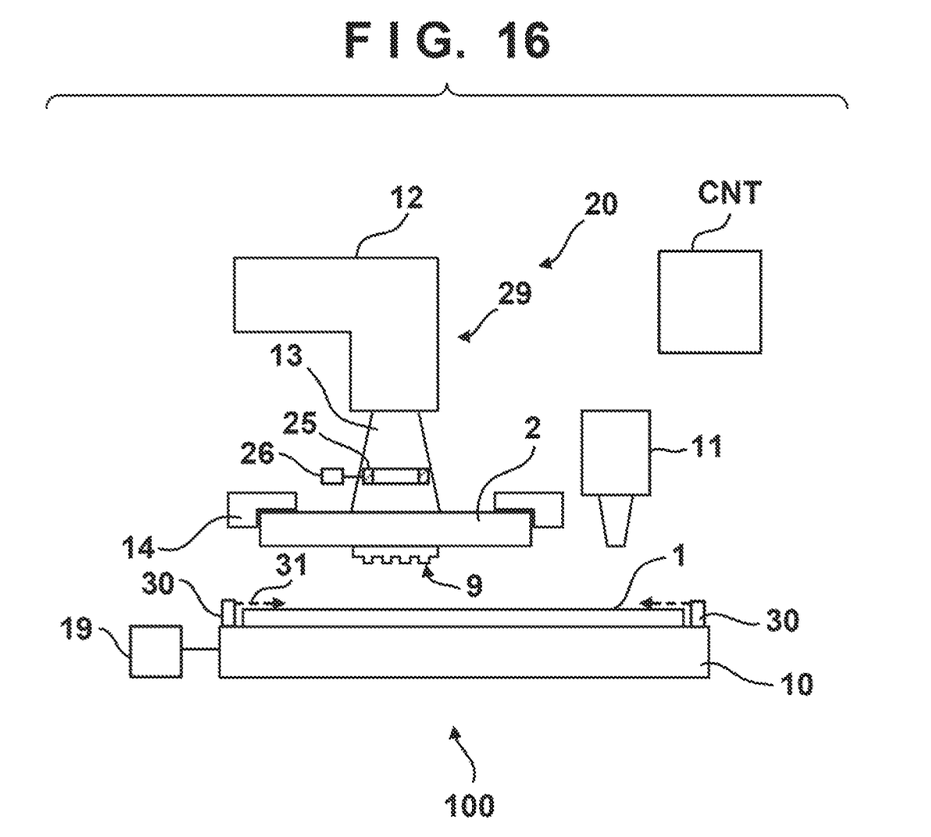
FIG. 16 is a view illustrating a fourth configuration example of the irradiation unit.

FIG. 16 illustrates the fourth configuration example of the irradiation unit 20. The irradiation unit 20 includes a first unit 30 which irradiates a near-edge region with light 31, and a second unit 29 which irradiates a pattern forming region with light. Note that the first unit 30 can be arranged on the substrate stage 10 to surround, for example, the substrate 1. The second unit 29 can be arranged to irradiate the pattern forming region on the substrate 1 with light through the mold 2.

A method of manufacturing an article using the above-mentioned imprint apparatus will be described below. The method of manufacturing an article includes a step of forming the pattern of a resin on a substrate using the above-mentioned imprint apparatus, and a step of processing (for example, etching) the substrate having the pattern formed on it. The article can be a device such as a semiconductor device, a liquid crystal display device, or a micromachine.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-164085, filed Jul. 24, 2012, which is hereby incorporated by reference herein in its entirety.

What is claimed is:

1. An imprint apparatus for imprinting a pattern of a mold to a photo-curing resin coated on a substrate, by bringing a pattern surface of the mold into contact with the resin, and curing the resin with light, to transfer the pattern of the mold onto the substrate, the imprint apparatus comprising:

an irradiation unit configured to irradiate light to the resin on the substrate; and a control unit configured to control the irradiation unit, wherein the substrate includes a plurality of shot regions including edge shot regions and non-edge shot regions, each of the edge shot regions being a shot region including an edge of the substrate, each of the edge shot regions including a first partial region located near and including the edge of the substrate and a second partial region different from the first partial region, the second partial region being located farther away from the edge of the substrate than the first partial region, the pattern on both the edge shot regions and on the non-edge shot regions being formed by the same mold, and wherein the control unit is configured to control the irradiation unit to:

when forming the pattern onto the edge shot region:
start irradiating light only to the resin on the first partial region before the pattern surface of the mold comes into contact with the resin in the second partial region; and
thereafter irradiate light to the resin on the second partial region while in a state where the pattern surface of the mold has been brought into contact with the resin on the first partial region and the second partial region; and when forming the pattern onto the non-edge shot region, irradiate the resin on the non-edge shot region while in a state where the pattern surface of the mold has been brought into contact with the resin on the non-edge shot region.

2. The apparatus according to claim 1, wherein the control unit controls the irradiation unit to start irradiation of light to the first partial region before the resin on the second partial region spreads onto the first partial region.

3. The apparatus according to claim 1, further comprising:
a coating unit that coats the resin on a shot region, among a plurality of shot regions,
wherein the coating unit does not coat the resin on the first partial region of the shot region.

4. The apparatus according to claim 1, wherein the irradiation unit includes a mask used to block light from a light source to not irradiate light to the second partial region in irradiating light to the first partial region.

5. The apparatus according to claim 4, wherein the irradiation unit further includes a positioning mechanism that positions the mask in accordance with an edge shot region on which a pattern is to be formed with the resin, among the edge shot regions.

6. The apparatus according to claim 5, wherein the mask has an arcuated outer edge.

7. The apparatus according to claim 5, wherein the positioning mechanism includes:
a rotational driving mechanism that rotationally drives the mask; and
a translational driving mechanism that translationally drives the mask.

8. The apparatus according to claim 1, wherein the irradiation unit includes:
a first unit that irradiates light to the edge shot regions; and
a second unit that irradiates light to the non-edge shot regions.

9. The apparatus according to claim 8, wherein the first unit is arranged on a substrate stage that holds the substrate.

10. The apparatus according to claim 1, wherein the pattern surface of the mold is larger than each edge shot region.

11. The apparatus according to claim 1, wherein when imprinting is performed for each of the non-edge shot regions, the control unit controls the irradiation unit to irradiate light to the resin on the non-edge shot region only after the pattern surface is in contact with the resin on the non-edge shot region.

12. An imprint apparatus for imprinting a pattern of a mold to a photo-curing resin coated on a substrate, by bringing a pattern surface of the mold into contact with the resin, and curing the resin with light, to transfer the pattern of the mold onto the substrate, the imprint apparatus comprising:
a substrate stage configured to hold the substrate; and
an irradiation unit configured to irradiate light to the resin on the substrate,
wherein the substrate includes a plurality of shot regions including edge shot regions and non-edge shot regions, each of the edge shot regions being a shot region having an edge of the substrate, each of the edge shot regions including a first partial region located near and including the edge of the substrate and a second partial region different from the first partial region, the second partial region being located farther away from the edge of the substrate than the first partial region, the pattern on both the edge shot regions and on the non-edge shot regions being formed by the same mold,
wherein the irradiation unit is configured to control the irradiation unit to:
when forming the pattern onto the edge shot region;
start irradiating light only to the resin on the first partial region before the pattern surface of the mold comes into contact with the resin in the second partial region, the resin being spread from a position on the second partial region to a position on the first partial region as the pattern surface of the mold comes into contact with the resin on the second partial region; and
thereafter irradiate light to the resin on the second partial region while in a state where the pattern surface of the mold has been brought into contact with the resin on the second partial region; and
when forming the pattern onto the non-edge shot region, irradiate the resin on the non-edge shot region while in a state where the pattern surface of the mold has been brought into contact with the resin on the non-edge shot region, and
wherein the irradiation unit includes a unit arranged on the substrate stage and configured to irradiate light to the first partial region.

13. An imprint apparatus for imprinting a pattern of a mold to a photo-curing resin coated on a substrate, by bringing a pattern surface of the mold into contact with the resin, and curing the resin with light, to transfer the pattern of the mold onto the substrate, the imprint apparatus comprising:
an irradiation unit configured to irradiate light to the resin on the substrate; and
a control unit configured to control the irradiation unit,
wherein the substrate includes a plurality of shot regions including edge shot regions and non-edge shot regions, each of the edge shot regions being a shot region having an edge of the substrate, each of the edge shot regions including a first partial region located near and including the edge of the substrate and a second partial region different from the first partial region, the second partial region being located farther away from the edge of the substrate than the first partial region, the pattern on both the edge shot regions and on the non-edge shot regions being formed by the same mold,
wherein the control unit is configured to control the irradiation unit to:
when forming the pattern onto the edge shot region:
start irradiating light only to the resin on the first partial region before the pattern surface of the mold comes into contact with the resin in the second partial region;

thereafter irradiate light to the resin on the second partial region while in a state where the pattern surface of the mold has been brought into contact with the resin on the second partial region; and control, when irradiating light to only the resin on the first partial region, at least one of (a) time for irradiating light only to the resin on the first partial region or (b) a wavelength of light irradiating only to the resin on the first partial region, so that the resin on the first partial region is not completely cured, and when forming the pattern onto the non-edge shot region, irradiate the resin on the non-edge shot region while in a state where the pattern surface of the mold has been brought into contact with the resin on the non-edge shot region.

14. An imprint apparatus for imprinting a pattern of a mold to a photo-curing resin coated on a substrate, by bringing a pattern surface of the mold into contact with the resin, and curing the resin with light, to transfer the pattern of the mold onto the substrate, the imprint apparatus comprising:

a coating unit configured to coat the resin on the substrate; and an irradiation unit configured to irradiate light to the resin on the substrate, wherein the substrate includes a plurality of shot regions including edge shot regions and non-edge shot regions, each of the edge shot regions being a shot region having an edge of the substrate, each of the edge shot regions including a first partial region located near and including the edge of the substrate and a second partial region different from the first partial region, the second partial region being located farther away from the edge of the substrate than the first partial region, the pattern on both the edge shot regions and on the non-edge shot regions being formed by the same mold, wherein the coating unit is configured to supply the resin on the first and second partial regions of an edge shot region, among the plurality of shot regions, on which a pattern is to be formed by the resin, and supply the resin on a non-edge shot region, among the plurality of shot regions, on which a pattern is to be formed by the resin, wherein the irradiation unit is configured to:
when forming the pattern onto the edge shot region:
start irradiating light to the resin on the first partial region, among the resin on the first partial region and the resin on the second partial region, before the pattern surface of the mold comes into contact with the resin in the second partial region; and
thereafter irradiate light to the resin on the second partial region with light while in a state where the pattern surface of the mold has been brought into contact with the resin on the second partial region, and when forming the pattern onto the non-edge shot region, irradiate the resin on the non-edge shot region while in a state where the pattern surface of the mold has been brought into contact with the resin on the non-edge shot region.

15. An imprint apparatus for imprinting a pattern of a mold to a photo-curing resin coated on a substrate, by bringing a pattern surface of the mold into contact with the resin, and curing the resin with light, to transfer the pattern of the mold onto the substrate, the imprint apparatus comprising:

an irradiation unit configured to irradiate light to the resin on the substrate; and a control unit configured to control the irradiation unit, wherein the substrate includes a plurality of shot regions including edge shot regions and non-edge shot regions, each of the edge shot regions being a shot region having an edge of the substrate, each of the edge shot regions including a first partial region located near and including the edge of the substrate and a second partial region different from the first partial region, the second partial region being located farther away from the edge of the substrate than the first partial region, the pattern on both the edge shot regions and on the non-edge shot regions being formed by the same mold, wherein the control unit is configured to control the irradiation unit to:
when forming the pattern on the edge shot region:
start irradiating light from a light source, in a first period, to the resin on the first partial region before the pattern surface of the mold comes into contact with the resin in the second partial region; and
thereafter irradiate light from the light source, in a second period, to the resin on the second partial region while in a state where the pattern surface of the mold has been brought into contact with the resin on the second partial region; and
when forming the pattern onto the non-edge shot region, irradiate the resin on the non-edge shot region while in a state where the pattern surface of the mold has been brought into contact with the resin on the non-edge shot region, and wherein the irradiation unit includes a first mask used in the first period to block part of light from the light source so that the resin on the second partial region is not irradiated with light from the light source, and a second mask used in the second period to block part of light from the light source so that a shot region located around the edge shot region whose second partial region has been irradiated with light from the light source in the first period, is not irradiated with light from the light source.

* * * * *